United States Patent
Kamikoriyama et al.

(10) Patent No.: US 10,340,154 B2
(45) Date of Patent: Jul. 2, 2019

(54) BONDING JUNCTION STRUCTURE

(71) Applicant: Mitsui Mining & Smelting Co., Ltd., Tokyo (JP)

(72) Inventors: Yoichi Kamikoriyama, Saitama (JP); Shinichi Yamauchi, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/761,113

(22) PCT Filed: Sep. 29, 2016

(86) PCT No.: PCT/JP2016/078946
§ 371 (c)(1),
(2) Date: Mar. 19, 2018

(87) PCT Pub. No.: WO2017/057645
PCT Pub. Date: Apr. 6, 2017

(65) Prior Publication Data
US 2018/0269074 A1 Sep. 20, 2018

(30) Foreign Application Priority Data
Oct. 2, 2015 (JP) .................................. 2015-196957

(51) Int. Cl.
*H01L 23/34* (2006.01)
*H01L 21/52* (2006.01)
(Continued)

(52) U.S. Cl.
CPC ................ *H01L 21/52* (2013.01); *B22F 7/08* (2013.01); *H01L 21/02433* (2013.01);
(Continued)

(58) Field of Classification Search
CPC ....... H01L 23/345; H01L 24/12; H01L 24/28; H01L 21/52; H01L 21/02433; H01L 21/477; B22F 7/08
See application file for complete search history.

(56) References Cited

U.S. PATENT DOCUMENTS 5,153,077 A * 10/1992 Kashiba ................ C04B 37/026
257/E23.006
5,217,814 A * 6/1993 Kawakami .......... C22C 32/0089
428/545
(Continued)

FOREIGN PATENT DOCUMENTS

EP 3 056 303 8/2016
JP 2008-244242 10/2008
(Continued)

OTHER PUBLICATIONS

International Search Report, PCT/JP2016/078946, dated Dec. 13, 2016.
(Continued)

*Primary Examiner* — Ida M Soward
(74) *Attorney, Agent, or Firm* — Young & Thompson

(57) ABSTRACT

Provided is a bonding joining structure in which a heat generating body and a support including a metal are joined to each other via a joint portion composed of a sintered body of copper powder. The support contains copper or gold, the copper or gold being present in at least an outermost surface of the support. An interdiffusion portion in which copper or gold contained in the support and copper contained in the sintered body is formed so as to straddle a bonding interface between the support and the sintered body. Preferably, a copper crystal structure having the same crystal orientation is formed in the interdiffusion portion so as to straddle the bonding interface.

16 Claims, 6 Drawing Sheets

(51) Int. Cl.
*H01L 21/02* (2006.01)
*H01L 21/47* (2006.01)
*B22F 7/08* (2006.01)
*H01L 21/477* (2006.01)
*H01L 23/00* (2006.01)

(52) U.S. Cl.
CPC .......... H01L 21/477 (2013.01); H01L 23/345 (2013.01); H01L 24/12 (2013.01); H01L 24/28 (2013.01); *H01L 2224/37147* (2013.01); *H01L 2924/01028* (2013.01); *H01L 2924/01029* (2013.01); *H01L 2924/01079* (2013.01)

(56) References Cited

U.S. PATENT DOCUMENTS

| | | | |
|---|---|---|---|
| 5,561,321 A * | 10/1996 | Hirano | B32B 15/01 257/700 |
| 6,823,915 B2 * | 11/2004 | Schwarzbauer | H01L 23/3737 156/349 |
| 8,008,772 B2 | 8/2011 | Morita et al. | |
| 8,840,811 B2 * | 9/2014 | Yasuda | B22F 1/0074 228/194 |
| 9,045,674 B2 * | 6/2015 | Iruvanti | B82Y 30/00 |
| 9,246,076 B2 * | 1/2016 | Jinushi | H01L 35/34 |
| 9,512,291 B2 * | 12/2016 | Borca-Tasciuc | B82Y 30/00 |
| 9,520,236 B2 * | 12/2016 | Ikeda | H01G 4/2325 |
| 9,583,453 B2 * | 2/2017 | Shearer | H01L 24/29 |
| 9,860,989 B2 | 1/2018 | Kiyono et al. | |
| 2006/0124280 A1 * | 6/2006 | Lee | F28D 15/0233 165/104.26 |
| 2008/0023665 A1 * | 1/2008 | Weiser | H01L 23/3733 252/71 |
| 2008/0237851 A1 | 10/2008 | Morita et al. | |
| 2009/0096100 A1 | 4/2009 | Kajiwara et al. | |
| 2011/0038124 A1 * | 2/2011 | Burnham | H01L 23/3737 361/717 |
| 2012/0312864 A1 | 12/2012 | Guth et al. | |
| 2013/0004779 A1 * | 1/2013 | Ogata | H01L 33/60 428/434 |
| 2014/0190545 A1 * | 7/2014 | Lei | H01L 31/0516 136/244 |
| 2015/0048510 A1 * | 2/2015 | Tomisaka | H01L 24/03 257/762 |
| 2016/0029483 A1 * | 1/2016 | Kawato | H05K 1/097 174/257 |
| 2016/0056500 A1 * | 2/2016 | Holme | H01M 10/0525 429/319 |
| 2016/0121395 A1 * | 5/2016 | Kawanaka | C09K 5/16 428/642 |
| 2016/0338201 A1 | 11/2016 | Kiyono et al. | |
| 2017/0287810 A1 * | 10/2017 | Morikawa | B22F 3/14 |
| 2018/0251663 A1 * | 9/2018 | Trumble | C08K 3/08 |

FOREIGN PATENT DOCUMENTS

| | | |
|---|---|---|
| JP | 2010-050189 | 3/2010 |
| JP | 2012-094873 | 5/2012 |
| JP | 2016-032051 | 3/2016 |
| WO | 2015-052791 | 4/2015 |
| WO | 2015-118982 | 8/2015 |

OTHER PUBLICATIONS

Kazaka et al., "Review of Joint Shear Strength of Nano-Silver Paste and Its Long-Term High Temperature Reliability," Journal of Electronic Materials, vol. 43, No. 7, 2014, pp. 2459-2466.

* cited by examiner

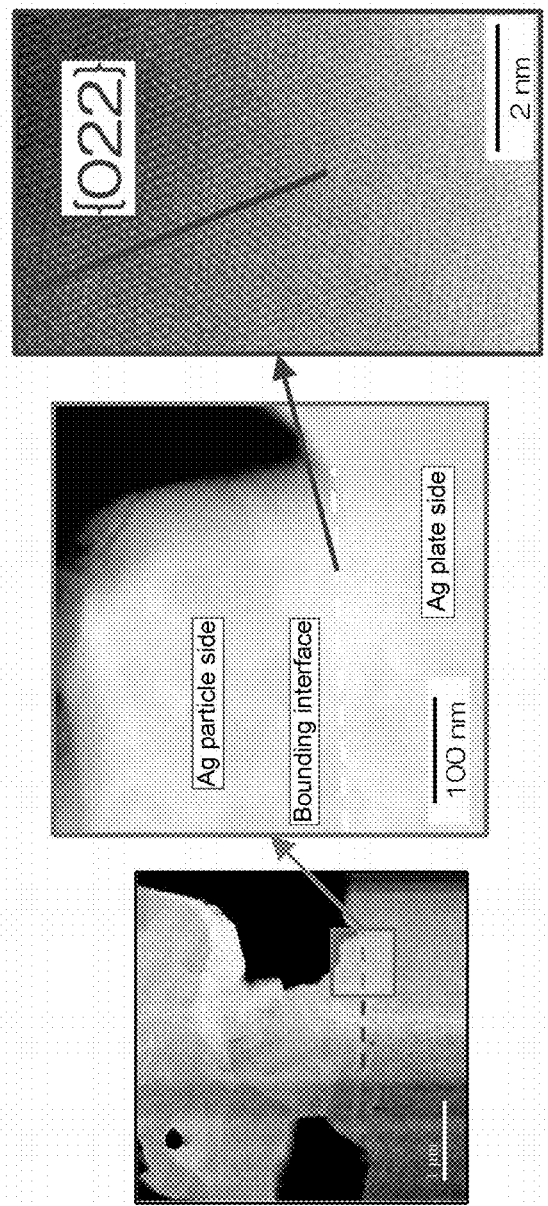

BONDING JUNCTION STRUCTURE

TECHNICAL FIELD

The present invention relates to a bonding joining structure, and more particularly relates to a bonding joining structure that is preferably used as a die bonding joining structure between a die of a semiconductor device and a metal support.

BACKGROUND ART

With regard to bonding of a semiconductor device, Patent Document 1 discloses a semiconductor apparatus having: a semiconductor device that has a collector electrode on one surface and an emitter electrode on the other surface; and an insulating substrate that has a first electrode interconnect on one surface. The first electrode interconnect of the insulating substrate and the collector electrode of the semiconductor device are connected to each other via a first bonding layer. This first bonding layer is a sintered layer obtained by sintering a bonding material and a reducing agent. The bonding material contains a metal particle precursor that is composed of silver carbonate and the like. The reducing agent is composed of particles of metal carboxylate that have a melting temperature of 200 degrees or more. The semiconductor device and the sintered layer are directly joined to each other as a result of metallic bonding. The technique disclosed in this document is aimed at enabling bonding through metallic bonding at a bonding interface to be realized at a lower temperature.

CITATION LIST

Patent Document
Patent Document 1: JP 2012-094873A

SUMMARY OF INVENTION

Incidentally, reducing power loss in inverters and converters is an essential issue in many fields such as automobiles, household electrical appliances, and industrial equipment. To address this issue, various semiconductor devices using new materials such as SiC and GaN in order to significantly improve the energy utilization efficiency of equipment have been proposed. These semiconductor devices involve the generation of a large amount of heat during operation. For this reason, semiconductor packages need to be provided with sufficient countermeasures for heat dissipation so as to prevent damage to the semiconductor devices caused by generated heat. Generally, a lead frame or a substrate to which a semiconductor device is joined and fixed is used for heat dissipation. Although the technique disclosed in Patent Document 1 above relates to bonding of a semiconductor device, this technique focuses on the bonding temperature and does not give consideration to heat dissipation.

Therefore, it is an object of the present invention to improve a bonding structure for various heat generating bodies including a die of a semiconductor device, and more particularly to provide a bonding structure that can efficiently dissipate heat generated from a heat generating body.

The present invention provides a bonding joining structure in which a heat generating body and a support including a metal are joined to each other via a joint portion composed of a sintered body of copper powder, wherein the support contains copper or gold, the copper or gold being present in at least an outermost surface of the support, and an interdiffusion portion in which copper or gold contained in the support and copper contained in the sintered body are diffused to each other is formed so as to straddle a bonding interface between the support and the sintered body.

The present invention especially provides the bonding joining structure, wherein the bonding joining structure is a die bonding joining structure in which a die of a semiconductor device, the die serving as the heat generating body, and the support including a metal are joined to each other via the joint portion composed of the sintered body of the copper powder, the support contains copper or gold, the copper or gold being present in at least the outermost surface of the support, and the interdiffusion portion in which copper or gold contained in the support and copper contained in the sintered body are diffused to each other is formed so as to straddle the bonding interface between the support and the sintered body.

The present invention also provides a bonding joining structure in which a heat generating body and a metal support are joined to each other via a joint portion composed of a sintered body of nickel powder, wherein the support contains nickel, the nickel being present in at least an outermost surface of the support, and an interdiffusion portion in which nickel contained in the support and nickel contained in the sintered body are diffused to each other is formed so as to straddle a bonding interface between the support and the sintered body.

The present invention also provides a bonding joining structure in which a heat generating body and a support including a metal are joined to each other via a joint portion composed of a sintered body of silver powder, wherein the support contains silver, the silver being present in at least an outermost surface of the support, and an interdiffusion portion in which silver contained in the support and silver contained in the sintered body are diffused to each other is formed so as to straddle a bonding interface between the support and the sintered body.

BRIEF DESCRIPTION OF DRAWINGS

FIG. 8 shows transmission electron microscope images of a portion in the vicinity of the bonding interface of a die bonding joining structure obtained in Example 4.

DESCRIPTION OF EMBODIMENTS

Figure 1:
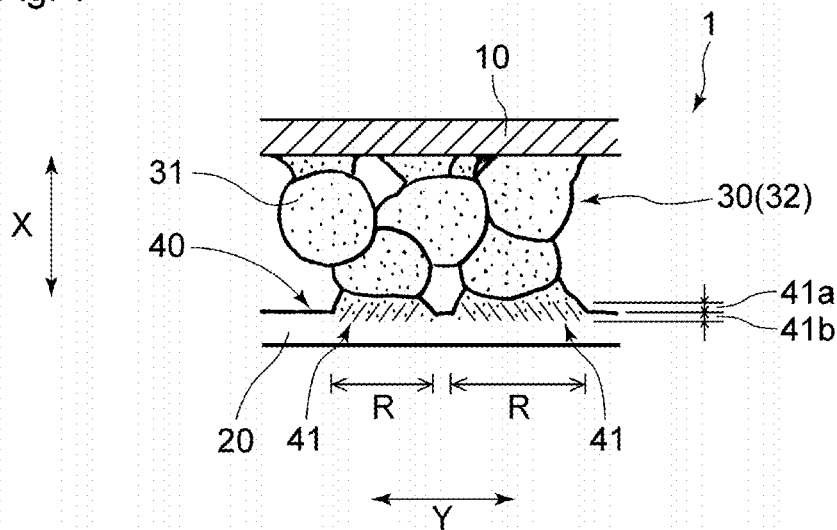
FIG. 1 is a schematic vertical cross-sectional view showing a die bonding joining structure, which is an embodiment of a bonding joining structure of the present invention.

Hereinafter, the present invention will be described based on preferred embodiments thereof with reference to the drawings. A bonding joining structure (hereinafter also referred to simply as "bonding structure") of the present invention has a structure in which a heat generating body and a support including a metal are joined to each other via a joint portion. The joint portion is composed of a sintered body made of copper powder. The type of heat generating body is not limited, and any member that generates heat during use can be considered as a heat generating body regardless of whether or not the member is intended for heat generation itself. A typical example of such a member is a die of a semiconductor device (hereinafter also referred to simply as "die"); however, the present invention is not limited to this, and, for example, a CPU, an LED device, a resistor, an electric circuit, and the like may also be used as the heat generating body. Moreover, in the present invention, another member that receives heat from a heat generating body, that is, a member that is joined to a heat generating body, for example, and that is heated as a result of that member conducting the heat generated from the heat generating body is also considered as a form of heat generating body. Hereinafter, the present invention will be described taking a die bonding joining structure in which a die is used as the heat generating body as an example.

Dies are obtained by individually separating a plurality of semiconductor devices formed on a wafer, and are also called chips, bare dies, and the like. A die is, for example, constituted by a semiconductor device such as a diode, a bipolar transistor, an insulated gate bipolar transistor (IGBT), a field-effect transistor (FET), a metal oxide semiconductor field-effect transistor (MOSFET), or a thyristor. Examples of the constituent material for these semiconductor devices include silicon (Si), silicon carbide (SiC), gallium nitride (GaN), and the like. As will be described later, the bonding structure of the present invention has excellent heat dissipation properties, so that when a semiconductor device that generates a large amount of heat, which is a so-called power device, is used as a joining-target die of the present invention, the effects of the present invention are notably achieved. Examples of such a power device include IGBTs, power MOSFETs, and various types of semiconductor devices composed of SiC and GaN.

The support is used to fix and support the die of the semiconductor device. To this end, for example, a lead frame, a substrate, or the like is used as the support. No matter what form the support takes, the support is made of metal. Since metals are materials having favorable thermal conductivity compared with other materials such as ceramics, use of a support made of a metal has the advantage of allowing heat that has been generated during operation of the semiconductor device to be easily released through the support.

There is no limitation on the type of the metal that composes the support, and the same materials as materials that have conventionally been used in the technical field of semiconductors can be used. For example, simple metals such as copper and aluminum can be used. Also, alloys such as a copper-iron alloy, an iron-nickel alloy, and a stainless steel alloy can be used. Furthermore, a support having a laminated structure in which a plurality of layers of different metal materials are laminated in a thickness direction can also be used. Each layer may be composed of a simple metal or may be composed of an alloy. An example of the support having a laminated structure is a support having a structure in which a base material layer is composed of a simple metal such as nickel, copper, or aluminum or an alloy and an outermost layer is composed of gold alone. The support is in a state in which copper or gold is present in at least the outermost surface of the support. "Outermost surface" of the support refers to a surface of the support to which the heat generating body or the die of the semiconductor device is fixed via a joint portion, that is, a surface of the support that opposes the joint portion. Examples of the support with copper or gold being present in at least the outermost surface of the support include a support composed of copper alone, a support composed of a copper-based alloy such as a copper-gold alloy, a support having a laminated structure in which the base material layer is composed of a simple metal such as nickel, copper, or aluminum or an alloy and the outermost layer is composed of gold alone, a support having a laminated structure in which the base material layer is composed of a simple metal such as nickel, aluminum or an alloy and the outermost layer is composed of an alloy that contains gold.

The die of the semiconductor device and the support are joined to each other via the joint portion. The joint portion is composed of a sintered body of copper powder (hereinafter also referred to simply as "sintered body"). The joint portion can be formed over the entire region of an opposing surface of the die that opposes the support or in a portion of that opposing surface. The sintered body of copper powder that composes the joint portion is formed by heating the copper powder containing a plurality of copper particles in a predetermined atmosphere at a temperature around the melting point of copper for a predetermined period of time and bonding the copper particles such that a necking portion is generated between the copper particles. The copper powder, which serves as the raw material for the joint portion, may be a powder of copper alone or may be a powder of a copper-based alloy that contains copper as the base material. Preferably, a powder consisting of copper alone is used. The sintered body of copper powder that composes the joint portion may also contain other materials in addition to copper or a copper alloy, if necessary. Examples of such materials include organic compounds that are used in order to prevent oxidation of the sintered body.

In the bonding structure of the present invention, an interdiffusion portion in which a metallic element contained in the support and a constituent element contained in the sintered body are diffused to each other is formed so as to straddle the bonding interface between the support and the sintered body. That is to say, a portion in which copper or gold contained in the support and copper contained in the sintered body are interdiffused is formed extending from the support side to the sintered body side across the bonding interface. This state will be described with reference to FIG. 1. As shown in FIG. 1, a bonding structure 1 has a structure in which a die 10 and a support 20 are joined to each other via a joint portion 30 that is composed of a sintered body 32 of copper powder containing a plurality of copper particles 31. Furthermore, the die bonding joining structure 1 has a bonding interface 40 between the support 20 and the sintered body 32. In the bonding structure 1, interdiffusion portions 41 in which the metallic element contained in the support 20 and the constituent element contained in the sintered body 32 are diffused to each other is formed so as to straddle the bonding interface 40. When the bonding structure 1 is viewed along a vertical cross-sectional direction X, which is a direction along a cross section that is orthogonal to the bonding interface, that is, when viewed along the up-down direction of the paper plane in FIG. 1, the interdiffusion portion 41 extends along the vertical cross-sectional direction X so as to straddle the bonding interface 40. When viewed in that vertical cross section, with respect to a plane direction Y, which is a direction along the bonding interface, that is, with respect to the left-right direction of the paper plane in FIG. 1, at the bonding interface, the copper particles 31 constituting the interdiffusion portions 41 each extend over a maximum region R along the plane direction Y, on the support 20.

Figure 2:
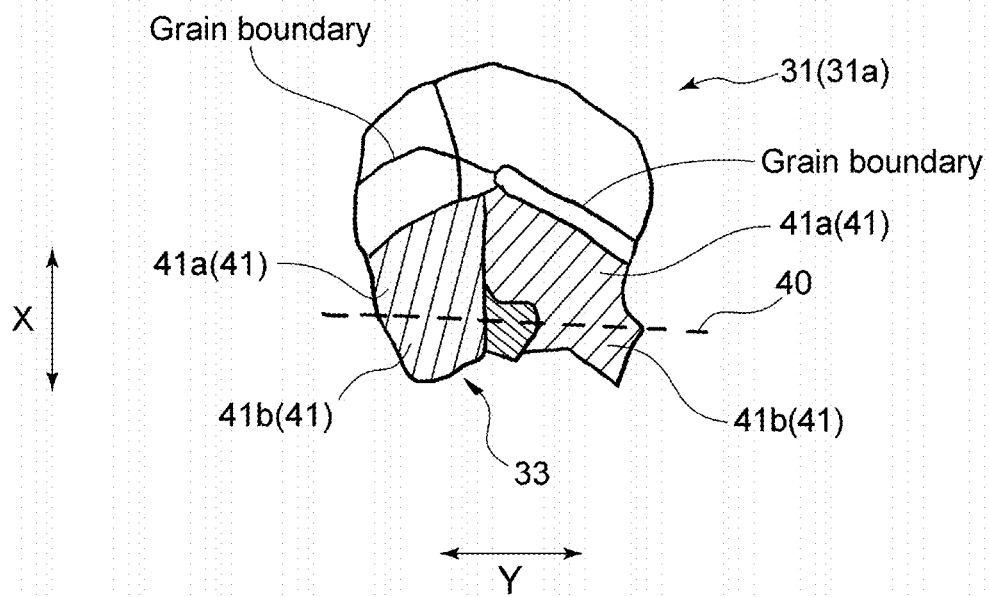
FIG. 2 schematically shows a relevant portion in FIG. 1 in an enlarged manner.

More specifically, as shown in FIG. 2, in the interdiffusion portions 41, a plurality of primary particles 31a constituting copper particles 31 that are joined to the support 20 when viewed along the vertical cross-sectional direction X do not have grain boundaries along a plane corresponding to the bonding interface 40. A "primary particle" refers to an object that is recognized as the minimum unit of a particle judging from the external geometric form of that object.

In the interdiffusion portions 41, constituent elements are bonded as a result of metallic bonding. Specifically, in the case where the metallic element that is present in the outermost layer of the support 20 is the same as the constituent element of the sintered body 32, a single phase composed of a simple metal or an alloy is formed in the interdiffusion portions 41. In the case where the metallic element of the support 20 is different from the constituent element of the sintered body 32, an alloy phase containing the metallic element of the support 20 and the constituent element of the sintered body 32 is formed. "Metallic bonding" refers to bonding between metal atoms via free electrons.

Due to the fact that the configuration in which the interdiffusion portions 41 are formed in the bonding structure 1 and that the interdiffusion portions 41 contain a phase in which constituent elements are bonded through metallic bonding, free electrons are present in the interdiffusion portions 41, and thus, the interdiffusion portions 41 have favorable thermal conductivity. As a result, when the die 10 of the semiconductor device generates heat due to operating, the generated heat is easily transferred to the support 20, which is a member that is located on the opposite side to the die 10 across the joint portion 30. In other words, heat that has been generated from the die 10 of the semiconductor device is dissipated. Thus, the semiconductor device is unlikely to be thermally damaged. This is important in terms of the operational stability and the reliability of the semiconductor device.

In the case where the outermost surface of the support 20 is composed of copper alone and where the copper powder is also composed of copper alone, the interdiffusion portions 41 each contain a single phase constituted by a crystal structure consisting of copper alone. It is preferable that, as shown in FIG. 2, in the crystal structure of this single phase, a portion 41a that is located on the sintered body 32 side of the bonding interface 40 and a portion 41b that is located on the support 20 side of the bonding interface 40 have the same crystal orientation. When the interdiffusion portion 41a that is located on the sintered body 32 side of the bonding interface 40 and the interdiffusion portion 41b that is located on the support 20 side of the bonding interface 40 have the same crystal orientation as described above, the crystal orientation intersects the bonding interface 40, free electrons move smoothly between the interdiffusion portions 41a and 41b, and the interdiffusion portion 41 has even more favorable thermal conductivity. As a result, heat that has been generated from the die 10 of the semiconductor device is even more easily dissipated, and the semiconductor device is even less likely to be thermally damaged. Crystal orientations of copper crystal structures can be determined from a transmission electronic microscope (TEM) image of the interdiffusion portions 41.

It should be noted that, in order to form a copper crystal structure having the same crystal orientation in each interdiffusion portion so as to straddle the bonding interface, it is preferable to use a copper powder as the copper source for the joint portion. If other copper sources, for example, various types of copper oxides such as cupric oxide are used, even though a sintered body can be obtained, it is not easy to form a copper crystal structure having the same crystal orientation in each interdiffusion portion so as to straddle the bonding interface.

In each interdiffusion portion 41, it is sufficient that the crystal orientations at any crystal plane of the copper crystal structure are the same, and it is not necessary that the crystal orientations are the same at a specific crystal plane. In an example (FIG. 4), which will be described later, crystal orientations of {111} planes of copper are measured; however, the reason for this is that it is easy to observe {111} planes of copper in TEM, and it is not necessary that the {111} planes of copper be in the same direction. Moreover, in the case where a single copper particle 31 has the crystal structures (crystal grains) of a plurality of single crystals, the crystal orientation may be different among those crystal structures.

From the standpoint of further increasing the efficiency of thermal conduction via the interdiffusion portions 41, each copper crystal structure having the same crystal orientation preferably has a traverse length (in FIG. 2, width, or length in the plane direction Y, of each crystal grain) of not less than 10 nm and more preferably not less than 50 nm at the bonding interface 40. The upper limit of the traverse length is not limited, but may typically be about 500 nm. The traverse length can be measured from a transmission electronic microscope (TEM) image of the interdiffusion portions 41. The measurement is performed with respect to five positions, and the average value is used as the traverse length.

From the same standpoint as that described above, each copper crystal structure having the same crystal orientation preferably has a maximum thickness straddling the bonding interface 40 of not less than 10 nm and more preferably not less than 50 nm. The upper limit of the thickness of the crystal structure straddling the bonding interface 40 is not limited, but may typically be about 1000 nm and more typically about 500 nm. The thickness can be measured from a transmission electronic microscope (TEM) image of the interdiffusion portions 41. The measurement is performed at five positions that are located at regular intervals along the direction of the plane of the bonding interface, and the largest value is used as the thickness.

In the bonding structure 1 having the above-described structure, since the sintered body 32 contains copper, and the support 20 is made of metal, electrical continuity is established between the sintered body 32 and the support 20. On the other hand, electrical continuity between the sintered body 32 and the die 10 may be established or may not be established. Considering that an object of the present invention is to dissipate heat generated from the die 10 of the semiconductor device, it is clear that the establishment of electrical continuity between the sintered body 32 and the support 20 and the establishment of electrical continuity between the sintered body 32 and the die 10 are not essential to the present invention.

Although a case in which the joint portion is composed of a sintered body made of a copper powder has been described above, the joint portion may also be composed of a sintered body of nickel powder or a sintered body of silver powder, instead of the sintered body of a copper powder. In this case, the material for the outermost surface of the support is nickel when a sintered body of nickel powder is used or is silver when a sintered body of silver powder is used. Then, in the bonding structure of the present invention, when the sintered body of nickel powder is used, interdiffusion portions including nickel contained in the support and nickel contained in the sintered body are formed so as to straddle the bonding interface between the support and the sintered body. When the sintered body of silver powder is used, interdiffusion portions including the silver of the support and the silver of the sintered body are formed so as to straddle the bonding interface between the support and the sintered body.

In both the case where interdiffusion portions of nickel are formed in the joint portion and the case where interdiffusion portions of silver are formed in the joint portion, it is preferable that, in each of the interdiffusion portions, a nickel or silver crystal structure having the same crystal orientation is formed so as to straddle the bonding interface, because the joint portion thereby has even more favorable thermal conductivity. In the interdiffusion portions, it is sufficient that the crystal orientations at any crystal plane of the nickel or silver crystal structure are the same, and it is not necessary that the crystal orientations are the same at a specific crystal plane.

With respect to details of the cases where the joint portion is composed of nickel or silver, details of the above-described case where the joint portion is composed of copper will be appropriately applied to those points that are not elaborated.

Figure 3:
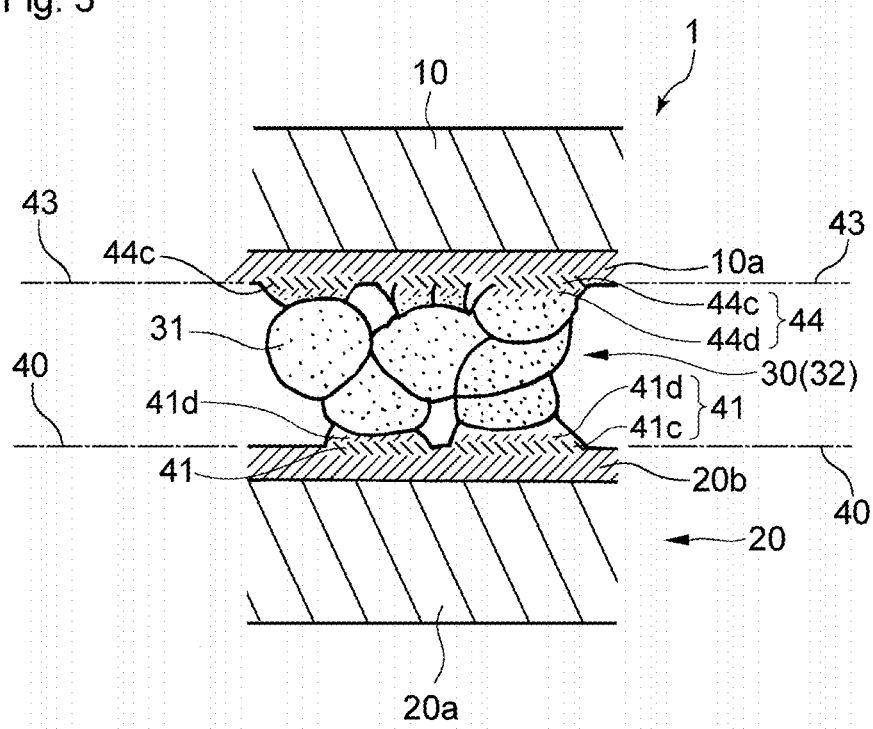
FIG. 3 is a schematic vertical cross-sectional view (corresponding to FIG. 1) showing a die bonding joining structure, which is another embodiment of the bonding joining structure of the present invention.

FIG. 3 shows another embodiment of the die bonding joining structure of the present invention. It should be noted that the description of the embodiment shown in FIGS. 1 and 2 will be appropriately applied to those points that are not elaborated regarding the present embodiment. The present embodiment relates to the support 20 having the outermost surface of a base material 20a of the support 20 being composed of gold alone 20b, and the bonding structure 1 that is formed by sintering a copper powder composed of copper alone. In the bonding structure 1, it is preferable that the interdiffusion portions 41 contain $Cu_3Au$. Preferably, $Cu_3Au$ is in an alloyed state. A portion 41c that is composed of $Cu_3Au$ has favorable thermal conductivity. As a result, heat that has been generated from the die 10 of the semiconductor device is dissipated even more. Therefore, the semiconductor device is even less likely to be thermally damaged.

The presence of the $Cu_3Au$ portion 41c in the alloyed state in each interdiffusion portion 41 can be confirmed by performing element mapping of the interdiffusion portion 41 and determining the element distribution along the vertical cross-sectional direction X. In this element distribution, if a region in which the molar ratio of copper to gold is 3:1 and where the molar ratio is maintained can be identified, it can be judged that $Cu_3Au$ in the alloyed state is present in that region. Moreover, the presence or absence of $Cu_3Au$ in the alloyed state can also be judged by performing electron diffraction measurement of the interdiffusion portions 41.

It is more preferable that, in addition to including the $Cu_3Au$ portion 41c, each interdiffusion portion 41 of the bonding structure 1 of the embodiment shown in FIG. 3 includes a solid solution portion 41d that is composed of a solid solution of gold and copper. The solid solution portion 41d is a portion composed of a solid solution of gold in copper which serves as the base material. In the solid solution portion 41d, it is preferable that the distribution of copper when viewed along the vertical cross-sectional direction X of the bonding structure 1 gradually decreases from the sintered body 32 side toward the support 20 side. On the other hand, with regard to the distribution of gold, it is preferable that the distribution of gold when viewed along the vertical cross-sectional direction X of the bonding structure 1 gradually increases from the sintered body 32 side toward the support 20 side. Preferably, in each interdiffusion portion 41, the solid solution portion 41d is located between the $Cu_3Au$ portion 41c and the sintered body 32, and due to this arrangement, the solid solution portion 41d has the function of increasing the bonding strength between the $Cu_3Au$ portion 41c and the sintered body 32. Moreover, the solid solution portion 41d also has the function of smoothly conducting heat from the sintered body 32 to the $Cu_3Au$ portion 41c. From the standpoint of making these functions even more prominent, it is preferable that the ratio between copper and gold in the solid solution portion 41d varies within a range from 0.01 mol or more to 0.33 mol or less of gold with respect to 1 mol of copper.

The presence of the solid solution portion 41d composed of copper and gold in each interdiffusion portion 41 can be confirmed by performing element mapping with respect to the solid solution portion 41d and determining the element distribution along the vertical cross-sectional direction X. Moreover, whether or not copper and gold form a solid solution can also be judged by performing electron diffraction measurement of the solid solution portion 41d.

With respect to the bonding structure 1 of the present embodiment, the die 10 of the semiconductor device may also have a surface layer 10a composed of gold alone and located on a bottom surface of the die 10, that is, a surface of the die 10 that opposes the support 20, and the bonding structure 1 may be formed by sintering this die 10 and a copper powder composed of copper alone. In this case, it is preferable that interdiffusion portions 44 containing gold of the surface layer 10a, which is formed on the bottom surface of the die 10, and copper, which is the constituent element of the sintered body, are formed so as to individually straddle a bonding interface 43 between the die 10 and the sintered body 32. These interdiffusion portions 44 each preferably contain a portion 44c that is composed of $Cu_3Au$. Details of the interdiffusion portions 44 are the same as those of the above-described interdiffusion portions 41, and their description is not repeated here.

Furthermore, it is more preferable that, in addition to the $Cu_3Au$ portion 44c, each interdiffusion portion 44 of the bonding structure 1 has a solid solution portion 44d that is composed of a solid solution of gold and copper. Preferably, the solid solution portion 44d is located between the $Cu_3Au$ portion 44c and the sintered body 32. In the solid solution portion 44d, it is preferable that the distribution of copper when viewed along the vertical cross-sectional direction X of the bonding structure 1 gradually decreases from the sintered body 32 side toward the die 10 side. On the other hand, with regard to the distribution of gold, it is preferable that the distribution of gold when viewed along the vertical cross-sectional direction X of the bonding structure 1 gradually increases from the sintered body 32 side toward the die 10 side.

Since the interdiffusion portions 44 containing $Cu_3Au$ are formed between the die 10 and the sintered body 32, and the interdiffusion portions 44 each contain the solid solution portion 44*d* in addition to the $Cu_3Au$ portion 44*c*, heat that has been generated from the die 10 is smoothly conducted to the sintered body 32, and this heat is further conducted to the support 20 via the interdiffusion portions 41 on the support 20 side. As a result, heat that has been generated from the die 10 of the semiconductor device is dissipated even more. Accordingly, the semiconductor device is even less likely to be thermally damaged.

Next, a preferred method for manufacturing the above-described bonding structure 1 will be described. First, a case will be described in which the bonding structure 1 shown in FIG. 1 is manufactured using a copper powder whose copper particles are composed of copper alone and a support whose outermost surface is composed of copper alone.

Generally, it is preferable that the copper powder is provided in paste form in view of ease of handling. It is preferable that the paste contains an organic solvent in addition to the copper powder. The same organic solvents as organic solvents that are used in copper conductive pastes can be used as the organic solvent without limitation. Examples of such organic solvents include monoalcohols, polyalcohols, polyalcohols alkyl ethers, polyalcohol aryl ethers, esters, nitrogen-containing heterocyclic compounds, amides, amines, saturated hydrocarbons, and the like. These organic solvents can be used alone or in combination of two or more. The concentration of copper in the paste is appropriately adjusted to a concentration that is suitable for handling.

The copper powder in paste form is applied to the outermost surface of the support 20. For example, the copper powder in paste form can be applied to the outermost surface of the support 20 using an apparatus such as a dispenser. At this time, the copper powder in paste form may be applied in a dotted arrangement like the spots on a dice or may be applied in a linear arrangement or a planar arrangement. Then, the die 10 is placed on the copper powder in paste form. In this state, heating is performed at a predetermined temperature, and thus, the copper particles constituting the copper powder are sintered together to give the sintered body 32. Simultaneously, the copper particles are sintered with the outermost surface of the support 20, and the copper particles are also sintered with the bottom surface of the die 10. Consequently, the die bonding joining structure 1 is formed, and the die 10 is fixed onto the support 20 via the sintered body 32. Moreover, the interdiffusion portions 41 are formed so as to individually straddle the bonding interface between the support 20 and the sintered body 32.

With respect to the sintering conditions, the sintering temperature is preferably between 150° C. and 400° C. inclusive and more preferably between 230° C. and 300° C. inclusive. On condition that the sintering temperature is within this range, the sintering time is preferably between 5 minutes and 60 minutes inclusive and more preferably between 7 minutes and 30 minutes inclusive. With regard to the sintering atmosphere, an oxidizing atmosphere such as air, an inert atmosphere such as nitrogen or argon, or a reducing atmosphere such as nitrogen-hydrogen can be used. Moreover, sintering may be performed in a vacuum. In particular, it is preferable to perform sintering in an inert atmosphere such as nitrogen in the presence of triethanolamine, because a copper crystal structure having the same crystal orientation can thereby be successfully formed in each interdiffusion portion so as to straddle the bonding interface.

In the case where the joint portion of the bonding structure 1 is composed of nickel or silver, nickel powder or silver powder can be used instead of the above-described copper powder. In particular, with regard to the nickel powder, it is preferable to use a nickel powder that is manufactured using a so-called polyol method, which is disclosed in, for example, JP 2009-187672A or the like, because a nickel crystal structure having the same crystal orientation can thereby be successfully formed in each interdiffusion portion so as to straddle the bonding interface. On the other hand, with regard to the silver powder, it is preferable to use a silver powder that is manufactured using a so-called wet reduction method, which is disclosed in, for example, JP 2009-242913A or the like, because a silver crystal structure having the same crystal orientation can thereby be successfully formed in each interdiffusion portion so as to straddle the bonding interface.

In the case where the copper powder is replaced with nickel powder, primary particles of the nickel powder preferably have an average particle diameter D between 20 nm and 300 nm inclusive. In the case where the copper powder is replaced with silver powder, primary particles of the silver powder preferably have an average particle diameter between 0.1 μm and 2 μm inclusive.

Next, a case will be described in which the bonding structure 1 shown in FIG. 3 is manufactured using a copper powder whose copper particles are composed of copper alone, a support whose outermost surface is composed of gold alone, and a die whose bottom surface is composed of gold alone.

As is the case with the above-described method, it is preferable to use the copper powder in paste form. The copper powder in paste form is applied to the outermost surface of the support 20 using an apparatus such as a dispenser, for example. At this time, as described above, the copper powder in paste form can be applied to the entire region of an opposing surface of the die that opposes the support or a portion of that opposing surface. For example, the copper powder in paste form may be applied in a dotted arrangement like the spots on a dice, or may be applied in a linear arrangement or in a planar arrangement. Then, the die 10 is placed on the copper powder in paste form. In this state, heating is performed at a predetermined temperature, and thus, the copper particles that constitute the copper powder are sintered together to give the sintered body 32. Simultaneously, the copper particles 31 form necking with gold contained in outermost surface of the support 20 and gold contained in the bottom surface of the die 10, and mainly the copper diffuses into gold. Then, gold contained in the outermost surface of the support 20 and gold contained in the bottom surface of the die 10 form metallic bonds that are mainly composed of $Cu_3Au$, which in turn constitute the interdiffusion portions 41 and 44. Furthermore, the solid solution portions 41*d* and 44*d* made of copper and gold are formed in the interdiffusion portions 41 and 44. The sintering conditions are the same as those of the above-described case.

In each of the above-described manufacturing methods, in order to successfully form the interdiffusion portions, it is advantageous to use a specific copper powder (hereinafter, also referred as to copper powder P) as the copper powder. Specifically, the interdiffusion portions can be successfully formed by using the copper powder P having an average particle diameter D of primary particles between 0.15 μm and 0.6 µm inclusive, having the value of the ratio of the average particle diameter D of the primary particles to an average particle diameter $D_{BET}$ that is calculated by assuming a spherical particle shape based on the BET specific surface area, that is, $D/D_{BET}$ between 0.8 and 4.0 inclusive, and having no layer for suppressing the agglomeration of particles provided on the surfaces of the particles. It is preferable to use the copper powder P alone or together with another copper powder. From the standpoint of suppressing shrinkage during sintering and increasing the bonding strength, it is preferable to use the copper powder P together with another copper powder having a larger particle diameter (e.g., having an average particle diameter D of about 1 to 5 µm) than the copper powder P. The copper powder may contain a copper powder having a layer for suppressing the agglomeration of particles provided on the surfaces of the particles as long as the significance of the present invention is not impaired. In the case where the copper powder P is used together with another copper powder, the copper powder P can be used in an amount of preferably not less than 50 mass % and more preferably not less than 55 mass % relative to the copper powder as a whole. The copper powder P will be described below.

When the average particle diameter D of the primary particles of the copper powder P is set at not more than 0.6 µm, during formation of the sintered body 32 using the copper powder P, the copper powder P is likely to be sintered at a low temperature, and also, a gap is unlikely to be formed between the particles 31, and the specific resistance of the sintered body 32 can be reduced. On the other hand, when the average particle diameter D of the primary particles of the copper powder P is set at not less than 0.15 µm, shrinkage of the particles during sintering of the copper powder can be prevented. From these standpoints, the average particle diameter D of the primary particles is preferably 0.15 to 0.6 µm and more preferably 0.15 to 0.4 µm. The "average particle diameter D of primary particles of "copper powder" refers to a volume average particle diameter that is obtained by observing the copper powder using a scanning electron microscope at a magnification of 10,000 times or 30,000 times, measuring the Ferret diameter in the horizontal direction with respect to 200 particles in the visual field, and calculating a sphere-equivalent value from the measured values. From the standpoint of increasing the dispersibility of the copper powder, it is preferable that the copper particles 31 have a spherical particle shape.

It is preferable that the copper powder P does not have a layer (hereinafter also referred to as "protective layer") for suppressing the agglomeration of particles on the surfaces of the particles. The configuration in which the copper powder P has an average particle diameter D within the above-described numerical range and does not have a protective layer on the surfaces of the particles significantly contributes to favorable low-temperature sinterability of the copper powder P. The protective layer may be formed by treating the surfaces of the copper particles with a surface treating agent in a downstream process of the manufacturing of the copper powder in order to, for example, increase the dispersibility and the like. Examples of such a surface treating agent include various organic compounds such as fatty acids including stearic acid, lauric acid, and oleic acid, as well as coupling agents containing a semi-metal or a metal such as silicon, titanium, or zirconium. Furthermore, even in the case where no surface treating agent is used in the downstream process of the manufacturing of the copper powder, a protective layer may be formed by adding a dispersant to a reaction mixture containing the copper source during the manufacturing of the copper powder using a wet reduction method. Examples of such a dispersant include phosphates such as sodium pyrophosphate and organic compounds such as gum arabic.

From the standpoint of improving the low-temperature sinterability of the copper powder P of the present invention even more, it is preferable that the content of the elements that form the protective layer in the copper powder is minimized Specifically, the total content of carbon, phosphorus, silicon, titanium, and zirconium, which are present in a conventional copper powder as the components of the protective layer, is preferably not more than 0.10 mass %, more preferably not more than 0.08 mass %, and even more preferably not more than 0.06 mass % relative to the copper powder.

The smaller the above-described total content, the better. However, if the total content is as low as about 0.06 mass %, the low-temperature sinterability of the copper powder P can be sufficiently improved. Moreover, if the carbon content of the copper powder is excessively high, a gas containing carbon may be generated when the copper powder P is sintered to form the sintered body 32, and due to this gas, the resulting film may crack or the film may separate from the substrate. When the above-described total content in the copper powder is low, problems that may be caused by the generation of carbon-containing gas can be prevented.

It is preferable that the copper powder P has a low impurity content and a high copper purity. Specifically, the copper content of the copper powder is preferably not less than 98 mass %, more preferably not less than 99 mass %, and even more preferably not less than 99.8 mass %.

Even though the copper powder P does not have a layer for suppressing the agglomeration of the particles 31 on the surfaces of the particles 31, the primary particles of the copper powder P are unlikely to agglomerate. The extent of agglomeration of the primary particles can be evaluated using, as a measure, the value of $D/D_{BET}$, which is the ratio between the average particle diameter $D_{BET}$ that is calculated by assuming a spherical particle shape based on the BET specific surface area and the average particle diameter D of the primary particles. The value of $D/D_{BET}$ of the copper powder is between 0.8 and 4.0 inclusive. The value of $D/D_{BET}$ is a measure that indicates how broad the particle diameter distribution of the copper powder is when compared with an ideal monodispersed state of a copper powder that has a uniform particle diameter and that is free from agglomeration, and can be used to estimate the degree of agglomeration.

Evaluation of the value of $D/D_{BET}$ is essentially based on the premise that the copper powder particles have little surface porosity and are homogenous, and also have a continuous distribution (unimodal distribution). Under this premise, when the value of $D/D_{BET}$ is 1, it can be construed that the copper powder is in the above-described ideal monodispersed state. On the other hand, when the value of $D/D_{BET}$ is greater than 1, it can be estimated that the greater the value of $D/D_{BET}$, the broader the particle diameter distribution of the copper powder, and accordingly, the less uniform the particle diameter or the higher the degree of agglomeration. It is rare that the value of $D/D_{BET}$ is smaller than 1, and such values are mostly observed with copper powders in a state that does not meet the above-described premise. The "state that does not meet the above-described premise" means, for example, a state in which the surfaces of the particles have pores, a state in which the surfaces of the particles are nonuniform, a state in which the particles agglomerate locally, and the like.

From the standpoint of further reducing agglomeration of the primary particles of the copper powder P, the value of $D/D_{BET}$ is preferably between 0.8 and 4.0 inclusive and more preferably between 0.9 and 1.8 inclusive. The value of $D_{BET}$ can be obtained by measuring the BET specific surface area of the copper powder P using a gas absorption method. The BET specific surface area is measured according to a single-point method using a FlowSorb 112300 manufactured by Shimadzu Corporation, for example. The amount of powder to be measured is set at 1.0 g. With regard to the preliminary degassing conditions, the degassing is performed at 150° C. for 15 minutes. The average particle diameter $D_{BET}$ is calculated from the obtained value of the BET specific surface area (SSA) and the density (8.94 g/cm$^3$) of copper at about room temperature using the equation below:

$$D_{BET}(\mu m)=6/(SSA(m^2/g)\times 8.94(g/cm^3))$$

The value of $D_{BET}$ itself is preferably between 0.08 μm and 0.6 μm inclusive, more preferably between 0.1 μm and 0.4 μm inclusive, and even more preferably between 0.2 μm and 0.4 μm inclusive. The value of the BET specific surface area of the copper powder P is preferably between 1.7 m$^2$/g and 8.5 m$^2$/g inclusive and more preferably between 2.5 m$^2$/g and 4 m$^2$/g inclusive.

The copper powder P has a crystallite diameter of preferably not more than 60 nm, more preferably not more than 50 nm, and even more preferably not more than 40 nm. The lower limit value of the crystallite diameter is preferably 20 nm. The low-temperature sinterability of the copper powder can be improved even more by setting the size of the crystallite diameter within this range. The crystallite diameter is obtained by performing X-ray diffraction measurement of the copper powder using a RINT-TTR III manufactured by Rigaku Corporation, for example, and calculating the crystallite diameter (nm) according to a Scherrer method using the obtained {111} peak.

Such the copper powder P has the feature of being easy to sinter even at a low temperature. Use of the copper powder P that is easy to sinter even at a low temperature facilitates the formation of a metallic bond between the die or the support and the sintered body during bonding of the die and the support via the sintered body of the copper powder, and consequently makes it possible to easily obtain the interdiffusion portions of the present invention.

Whether or not a copper powder is easy to sinter at a low temperature can be judged using the sintering onset temperature of that copper powder as a measure. The copper powder P that is preferably used in the present invention has a sintering onset temperature of preferably between 170° C. and 240° C. inclusive, more preferably between 170° C. and 235° C. inclusive, and even more preferably between 170° C. and 230° C. inclusive.

The above-described sintering onset temperature can be measured by allowing the copper powder P to stand in a furnace with a 3 vol % $H_2$—$N_2$ atmosphere and gradually increasing the temperature in the furnace. Specifically, the sintering onset temperature can be measured using a method that will be described below. Whether or not sintering has started is judged by observing the copper powder P taken out of the furnace, under a scanning electron microscope to see if surface association has occurred between particles. "Surface association" refers to a state in which particles are connected to each other such that the surface of a particle is continuous with the surface of another particle.

Method for Measuring Sintering Onset Temperature

A copper powder is placed on an aluminum table and kept at a set temperature of 160° C. for 1 hour in a 3 vol % $H_2$—$N_2$ atmosphere. Then, the copper powder is taken out of the furnace, and the copper powder is observed under a scanning electron microscope at a magnification of 50,000 times to see if surface association has occurred. In the case where surface association is not observed, the set temperature of the furnace is reset at a temperature that is 10° C. higher than the aforementioned set temperature, and whether or not surface association has occurred is examined in the same manner as described above at the new set temperature. This operation is repeated, and the set temperature of the furnace at which surface association is observed is used as the sintering onset temperature (° C.).

Next, a preferred method for manufacturing the above-described copper powder will be described. The present manufacturing method is based on the wet reduction of copper ions using hydrazine as a reducing agent, and one of the features of this method is that an organic solvent that is miscible with water and capable of reducing the surface tension of water is used as a solvent. Since the present manufacturing method uses such an organic solvent, the copper powder can be manufactured in an easy and simple manner.

In the present manufacturing method, a reaction mixture containing water and the above-described organic solvent as a liquid medium and also containing a monovalent or divalent copper source is mixed with hydrazine, and the copper source is reduced to generate copper particles. In the present manufacturing method, an operation for intentionally forming a protective layer is not performed.

Examples of the organic solvent include monohydric alcohols, polyhydric alcohols, esters of polyhydric alcohols, ketones, and ethers. The monohydric alcohols preferably have 1 to 5 carbon atoms and more preferably 1 to 4 carbon atoms. Specific examples of the monohydric alcohols include methanol, ethanol, n-propanol, isopropanol, and t-butanol.

Examples of the polyhydric alcohols include diols, such as ethylene glycol, 1,2-propylene glycol, and 1,3-propylene glycol, and triols, such as glycerol. Examples of the esters of polyhydric alcohols include fatty acid esters of the above-described polyhydric alcohols. For example, the fatty acid is preferably a monovalent fatty acid having 1 to 8 carbon atoms and more preferably 1 to 5 carbon atoms. The esters of polyhydric alcohols preferably have at least one hydroxyl group.

The ketones preferably have 1 to 6 carbon atoms and more preferably 1 to 4 carbon atoms in the alkyl group bonded to the carbonyl group. Specific examples of the ketones include ethyl methyl ketone and acetone. Examples of the ethers include dimethyl ether, ethyl methyl ether, and diethyl ether; oxetane, tetrahydrofuran, and tetrahydropyran, which are cyclic ethers; and macromolecular compounds such as polyethylene glycol and polypropylene glycol, which are polyethers.

Among the above-described various organic solvents, monohydric alcohols are preferably used in light of economic efficiency, safety, and the like.

In the above-described liquid medium, the ratio (mass of organic solvent/mass of water) of the mass of the organic solvent to the mass of water is preferably 1/99 to 90/10 and more preferably 1.5/98.5 to 90/10. When the ratio between water and the organic solvent is within this range, the surface tension of water during wet reduction can be appropriately reduced, so that a copper powder with the values of D and $D/D_{BET}$ within the above-described ranges can be easily obtained.

The above-described liquid medium is preferably composed only of the organic solvent and water. This is preferable from the standpoint of, for example, manufacturing a copper powder with no protective layer and few impurities without using a dispersant or the like.

In the present manufacturing method, a reaction mixture is prepared by dissolving or dispersing a copper source in the above-described liquid medium. An example of the method for preparing the reaction mixture is a method in which the liquid medium and the copper source are mixed and stirred. In the reaction mixture, the proportion of the copper source relative to the liquid medium is set such that the weight of the liquid medium per 1 g of the copper source is preferably between 4 g and 2000 g inclusive and more preferably between 8 g and 1000 g inclusive. It is preferable that the proportion of the copper source relative to the liquid medium is within this range, because the productivity of copper powder synthesis can thereby be increased.

Various monovalent or divalent copper compounds can be used as the above-described copper source. In particular, it is preferable to use copper acetate, copper hydroxide, copper sulfate, copper oxide, or cuprous oxide. When these copper compounds are used as the copper source, a copper powder with the values of D and $D/D_{BET}$ within the above-described ranges can be easily obtained. Also, a copper powder with few impurities can be obtained.

Then, the above-described reaction mixture is mixed with hydrazine. The amount of hydrazine to be added is preferably between 0.5 mol and 50 mol inclusive and more preferably between 1 mol and 20 mol inclusive with respect to 1 mol of copper. When the amount of hydrazine to be added is within this range, a copper powder having the value of $D/D_{BET}$ within the above-described range is easily obtained. For the same reason, the temperature of the reaction mixture is preferably maintained at a temperature between 40° C. and 90° C. inclusive and more preferably between 50° C. and 80° C. inclusive from the start to the end of the mixing. For the same reason, it is preferable to continue stirring the reaction mixture from the start to the end of the mixing.

It is preferable that the reaction mixture and hydrazine are mixed using either a method (a) or a method (b) below. In this manner, the occurrence of a problem due to a rapid reaction can be effectively prevented.

(a) Hydrazine is added to the reaction mixture a plurality of times at intervals.

(b) Hydrazine is added to the reaction mixture continuously for a predetermined period of time.

In the case (a), the "plurality of times" is preferably between about 2 times and 6 times inclusive. The intervals between additions of hydrazine are preferably between about 5 minutes and 90 minutes inclusive.

In the case (b), the "predetermined period of time" is preferably between about 1 minute and 180 minutes inclusive. It is preferable to continue stirring of the reaction mixture even after the completion of mixing with hydrazine to allow the reaction mixture to age. The reason for this is that, in this manner, a copper powder with the value of $D/D_{BET}$ within the above-described range is easily obtained.

In the present manufacturing method, it is preferable to use only hydrazine as the reducing agent, because a copper powder with few impurities can thereby be obtained. In this manner, a target copper powder can be obtained.

Although the present invention has been described based on the preferred embodiments above, the present invention is not limited to the foregoing embodiments. For example, in the embodiment shown in FIG. 1, crystal orientations of the copper crystal structures in the interdiffusion portions 41 may be determined with respect to a crystal plane other than {111} planes adopted in examples described later.

Moreover, although the foregoing embodiments are directed to a die bonding structure in which a die of a semiconductor device is used as the heat generating body, the present invention is not limited to this, and the present invention can be applied to bonding joint that uses a member other than a die of a semiconductor device as the heat generating body.

EXAMPLES

Hereinafter, the present invention will be described in greater detail using examples. However, the scope of the present invention is not limited to the examples below. It should be noted that, unless otherwise specified, "%" means "mass %", and "parts" means "parts by mass".

Example 1

In the present example, a die bonding joining structure having the structure shown in FIG. 1 was produced.

(1) Production of Copper Powder and Copper Paste

A 500-ml round-bottomed flask provided with a stirring blade was prepared. As a copper source, 15.71 g of copper acetate monohydrate was put into this round-bottomed flask. Furthermore, 10 g of water and 70.65 g of isopropanol serving as an organic solvent were put into this round-bottomed flask to obtain a reaction mixture. This reaction mixture was heated to 60° C. while being stirred at 150 rpm. While stirring was continued, 1.97 g of hydrazine monohydrate was added to the reaction mixture all at once. Then, the reaction mixture was stirred for 30 minutes. After that, 17.73 g of hydrazine monohydrate was added to the reaction mixture. The reaction mixture was further stirred for 30 minutes. After that, 7.88 g of hydrazine monohydrate was added to the reaction mixture. Then, the reaction mixture was continuously stirred for 1 hour while the temperature of the reaction mixture was kept at 60° C. After the reaction was completed, the entire amount of the reaction mixture was separated into solid and liquid portions. The obtained solid portion was washed through decantation using pure water. The washing was repeated until the conductivity of the supernatant was 1000 μS/cm or less. The washed product was separated into solid and liquid portions. Then, 160 g of ethanol was added to the obtained solid portion, and the mixture was filtered using a pressure filter. The filter cake was dried under reduced pressure at an ordinary temperature to give a target copper powder. With respect to this copper powder, the average particle diameter D of primary particles was 0.19 μm, the BET specific surface area (SSA) was 3.91 m$^2$/g, $D_{BET}$ was 0.17 μm, $D/D_{BET}$ was 1.1, the total content of C, P, Si, Ti, and Zr was 0.05%, the copper content was more than 99.8%, the crystallite diameter was 35 nm, and the sintering onset temperature was 170° C. This copper powder was mixed with a copper powder composed of copper particles formed through wet synthesis, namely, CS-20 (trade name) (cumulative volume particle diameter $D_{50}$=3.0 μm, which was measured at a cumulative volume of 50 vol % using a laser diffraction/scattering type particle size distribution measurement method) manufactured by Mitsui Mining & Smelting Co., Ltd. in a mass ratio of 56:44 to obtain a mixed copper powder. This mixed copper powder was mixed with triethanolamine, 3-glycidoxypropyltrimethoxysilane and methanol all of which are a mixed organic solvent, to prepare a copper paste. In the mixed organic solvent, the proportion of triethanolamine was 54%, the proportion of 3-glycidoxypropyltrimethoxysilane was 29%, and the proportion of methanol was 17%. The proportion of the mixed copper powder in the copper paste was 86%, and the proportion of the organic solvent was 14%.

(2) Production of Die Bonding Joining Structure

Figures 4A, 4B, 4C:
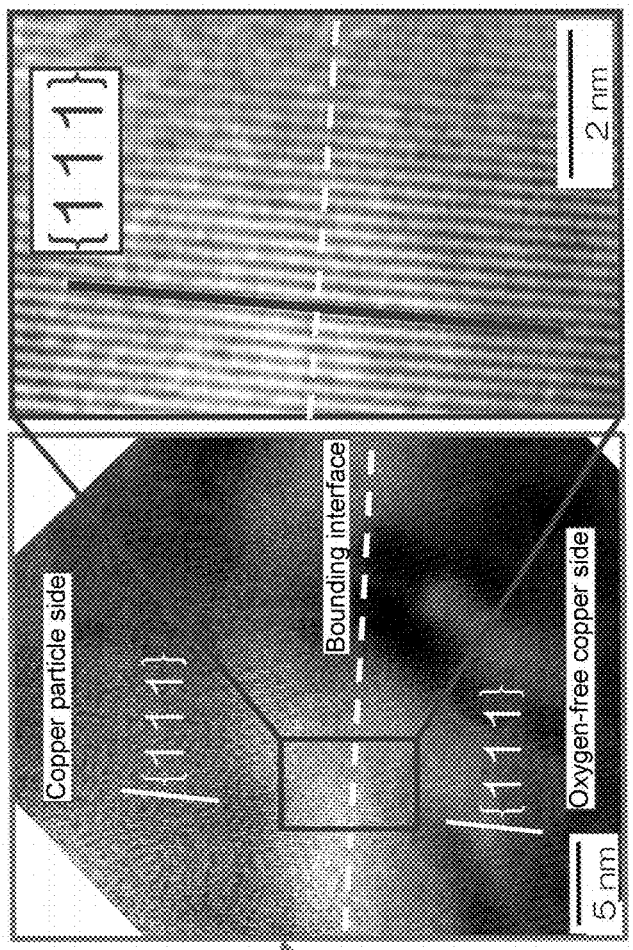
FIG. 4(a) is a transmission electron microscope image of a portion in the vicinity of a bonding interface of a die bonding joining structure obtained in Example 1.
FIG. 4(b) is a magnified image of an interdiffusion portion in FIG. 4(a)
FIG. 4(c) is a further magnified image of the image shown in FIG. 4(b).

The copper paste was applied to five positions on a 10-mm-square support made of oxygen-free copper (99.96% purity) and having a thickness of 0.5 mm through screen printing using a resin film screen with a thickness of 50 μm such that the applied copper paste at each position was formed into a shape with a diameter of 0.8 mm Oxygen-free copper (99.96% purity) formed into a shape that was 5 mm square with a thickness of 1 mm was placed on the center of the support as a die. Sintering was performed in a nitrogen atmosphere at 260° C. for 10 minutes to give a target bonding structure. FIGS. 4(a) to 4(c) show TEM images of a portion in the vicinity of a bonding interface between the sintered body and the support of the obtained bonding structure. As is clear from these images, it can be seen that an interdiffusion portion in which copper contained in the support and the copper contained in the sintered body are diffused to each other was formed so as to straddle the bonding interface between the support and the sintered body, and a copper crystal structure having the same crystal orientation was formed in the interdiffusion portion so as to straddle the bonding interface. The copper crystal structure having the same crystal orientation had a traverse length of 94 nm at the bonding interface. Moreover, the maximum thickness of the copper crystal structure straddling the bonding interface was 170 nm.

Comparative Example 1

(1) Production of Copper Paste

A mixed copper powder was used in which a copper powder composed of copper particles formed through wet synthesis, namely, 1050Y (trade name) manufactured by Mitsui Mining & Smelting Co., Ltd. and a copper powder composed of copper particles formed through wet synthesis, namely, 1300Y (trade name) manufactured by Mitsui Mining & Smelting Co., Ltd. were mixed in a mass ratio of 56:44. Both of the two types of copper powders that were used in Comparative Examples 1 and 2 had an organic protective layer on the surfaces of the particles thereof. Otherwise, the procedure was performed in the same manner as in (1) of Example 1, and thus a copper paste was prepared.

(2) Production of Die Bonding Joining Structure

A bonding structure was formed in the same manner as in (2) of Example 1. The obtained bonding structure did not have enough mechanical strength to maintain the bonding between the die, the sintered body, and the support, and it was not possible to evaluate the heat dissipation properties of the obtained bonding structure and to observe TEM images of a portion in the vicinity of the bonding interface between the sintered body and the support.

Comparative Example 2

(1) Production of Copper Paste

A mixed copper powder was used in which a copper powder composed of copper particles formed through wet synthesis, namely, 1050Y (trade name) manufactured by Mitsui Mining & Smelting Co., Ltd. and a copper powder composed of copper particles formed through wet synthesis, namely, 1300Y (trade name) manufactured by Mitsui Mining & Smelting Co., Ltd. were mixed in a mass ratio of 56:44. A mixed resin in which RE-303SL, which is a bisphenol F type epoxy resin manufactured by Nippon Kayaku Co., Ltd., RE-306, which is a phenol novolac type epoxy resin manufactured by Nippon Kayaku Co., Ltd., RE-310S, which is a bisphenol A type epoxy resin manufactured by Nippon Kayaku Co., Ltd., GAN, which is a liquid type epoxy resin manufactured by Nippon Kayaku Co., Ltd., KAYAHARD MCD, which is a hardener manufactured by Nippon Kayaku Co., Ltd., 2-(3,4-epoxycyclohexyl)ethyltrimethylsilane, 3-glycidoxypropyltrimethoxysilane, and Amicure MY24, which is a curing accelerator manufactured by Ajinomoto Fine-Techno Co., Inc., were mixed. The mixed copper powder and the mixed resin were mixed to prepare a copper paste. The mixed resin contained 31% RE-303SL, 15% RE-306, 15% RE-310S, 6% GAN, 28% KAYAHARD MCD, 1% 2-(3,4-epoxycyclohexyl)ethyltrimethylsilane, 1% 3-glycidoxypropyltrimethoxysilane, and 3% Amicure MY24. The copper paste contained 89% mixed copper powder and 11% mixed resin.

(2) Production of Die Bonding Joining Structure

A bonding structure was formed in the same manner as in (2) of Example 1. TEM images of a portion in the vicinity of the bonding interface between the sintered body and the support of the obtained bonding structure were captured, but an interdiffusion portion in which a copper crystal structure having the same crystal orientation was formed so as to straddle the bonding interface was not observed.

Comparative Example 3

Comparative Example 3 is an example of a bonding structure in which no copper powder was used.

(1) Preparation of Soldering Paste

A commercially available soldering paste (composition: Sn 63 mass %-Pb 37 mass %, manufactured by Hong Kong Welsolo Metal Technology Co., Limited) was prepared.

(2) Production of Die Bonding Joining Structure

The soldering paste was applied to five positions on a 10-mm-square support made of oxygen-free copper (99.96% purity) and having a thickness of 0.5 mm through screen printing using a resin film screen with a thickness of 50 μm such that the applied soldering paste at each position was formed into a shape with a diameter of 0.8 mm Oxygen-free copper (99.96% purity) formed into a shape that was 5 mm square with a thickness of 1 mm was placed on the center of the support as a die. Sintering was performed in a nitrogen atmosphere at 200° C. for 10 minutes to give a bonding structure.

Example 2

In the present example, a die bonding joining structure having the structure shown in FIG. 3 was produced.

(1) Production of Copper Powder and Copper Paste

A copper powder was obtained in the same manner as in Example 1 except that the amount of isopropanol used was 39.24 g, and the amount of water used was 50 g. With respect to this copper powder, the average particle diameter D was 0.24 μm, the BET specific surface area (SSA) was 3.17 m²/g, $D_{BET}$ was 0.21 μm, $D/D_{BET}$ was 1.2, the total content of C, P, Si, Ti, and Zr was 0.04%, the copper content was more than 99.8%, the crystallite diameter was 35 nm, and the sintering onset temperature was 170° C. This copper powder was mixed with a copper powder composed of copper particles formed through wet synthesis, namely, CS-20 (trade name) manufactured by Mitsui Mining & Smelting Co., Ltd. in a mass ratio of 56:44 to obtain a mixed copper powder. After that, the procedure was performed in the same manner as in Example 1, and thus a copper paste was prepared.

(2) Production of Die Bonding Joining Structure

Figure 5:
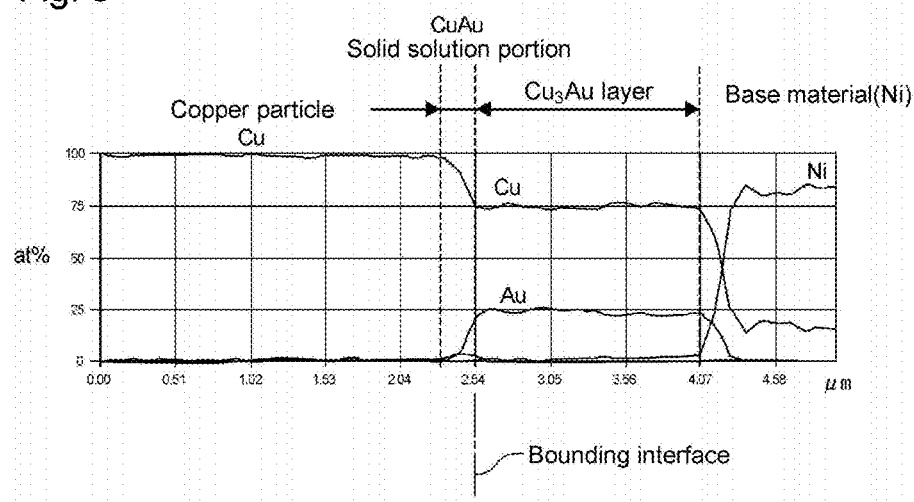
FIG. 5 is a graph showing an element distribution in the vicinity of the bonding interface of a die bonding joining structure obtained in Example 2.
Figure 6:
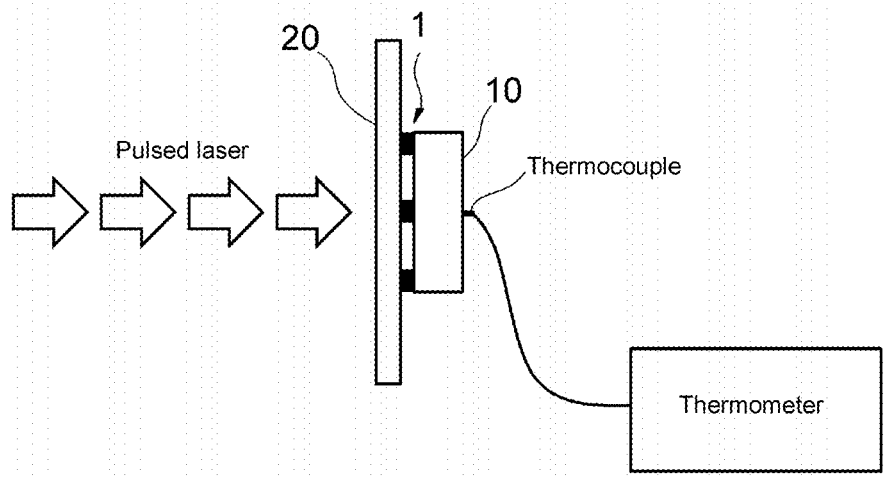
FIG. 6 schematically shows an apparatus for evaluating heat dissipation properties of die bonding joining structures obtained in examples and comparative examples.

A support was used in which a gold plating layer having a thickness of 1 µm was formed on the surface of a 10-mm-square base material made of nickel and having a thickness of 0.5 mm. The copper paste was applied to five positions on the surface of the gold plating layer of this support through screen printing using a resin film screen with a thickness of 50 µm such that the applied copper paste at each position was formed into a shape with a diameter of 0.8 mm A 5-mm-square nickel plate having a thickness of 0.5 mm was placed on the center of the support as a die. A gold plating layer having a thickness of 1 µm was formed on a bottom surface of the die beforehand. Sintering was performed in a nitrogen atmosphere at 260° C. for 10 minutes to give a target bonding structure. The element distribution in a depth direction in the vicinity of the bonding interface between the sintered body and the support of the obtained bonding structure was determined using a scanning transmission electron microscope (manufactured by JEOL Ltd.) provided with an energy-dispersive X-ray analyzer. FIG. 5 shows the results. As is clear from FIG. 5, it can be seen that an interdiffusion portion including a portion composed of $Cu_3Au$ and a portion composed of Au and Cu was formed so as to straddle the bonding interface between the support and the sintered body. It was confirmed from the results of electron diffraction that the interdiffusion portion was constituted by a $Cu_3Au$ alloy and a solid solution portion composed of a solid solution of Au in Cu. Moreover, it can be seen from FIG. 5 that, in the solid solution portion, the proportion of copper gradually decreased from the sintered body side toward the support side, and the proportion of gold gradually increased from the sintered body side toward the support side. In the solid solution portion, the number of moles of Au with respect to 1 mol of Cu was within a range of 0.01 mol to 0.33 mol.

Comparative Example 4

(1) Production of Copper Paste

A copper paste was prepared in the same manner as in (1) of Comparative Example 1.

(2) Production of Die Bonding Joining Structure

A bonding structure was formed in the same manner as in (2) of Example 2. The obtained bonding structure did not have enough mechanical strength to maintain the bonding between the die, the sintered body, and the support, and it was not possible to evaluate the heat dissipation properties of the obtained bonding structure and to determine the element distribution in the depth direction of a portion in the vicinity of the bonding interface between the sintered body and the support of the obtained bonding structure.

Comparative Example 5

(1) Production of Copper Paste

A copper paste was prepared in the same manner as in (1) of Comparative Example 2.

(2) Production of Die Bonding Joining Structure

A bonding structure was formed in the same manner as in (2) of Example 2. The element distribution in the depth direction in the vicinity of the bonding interface between the sintered body and the support of the obtained bonding structure was determined using a scanning transmission electron microscope (manufactured by JEOL Ltd.) provided with an energy-dispersive X-ray analyzer, but an interdiffusion portion including a portion composed of $Cu_3Au$ and straddling the bonding interface between the support and the sintered body was not observed.

Comparative Example 6

(1) Preparation of Soldering Paste

A soldering paste in which no copper powder was used was prepared in the same manner as in (1) of Comparative Example 3.

(2) Production of Die Bonding Joining Structure

A support was used in which a gold plating layer with a thickness of 1 µm was formed on the surface of a 10-mm-square base material made of nickel and having a thickness of 0.5 mm. The soldering paste was applied to five positions on the surface of the gold plating layer of this support through screen printing using a resin film screen having a thickness of 50 µm such that the applied soldering paste at each position was formed into a shape with a diameter of 0.8 mm A 5-mm-square nickel plate having a thickness of 0.5 mm was placed on the center of the support as a die. A gold plating layer having a thickness of 1 µm was formed on a bottom surface of the die beforehand. Sintering was performed in a nitrogen atmosphere at 200° C. for 10 minutes to give a bonding structure.

Evaluation

The heat dissipation properties of the die bonding joining structures obtained in the examples and the comparative examples were evaluated using a method described below. Table 1 below shows the results with respect to the above-described example and comparative examples regarding the die bonding joining structures with the structure shown in FIG. 1. Table 2 below shows the results with respect to the above-described example and comparative examples regarding the die bonding joining structures with the structure shown in FIG. 3.

Method for Evaluating Heat Dissipation Properties

Blackening treatment of a back surface, that is, a surface on which the die was not placed, of the support of each bonding structure was performed by applying a carbon spray to that surface. Then, this surface was irradiated with a pulsed laser beam at 3 kV using a thermal constant measurement apparatus TC-7000 manufactured by Shinku-Riko Inc., and a change in the surface temperature of the die over time after irradiation was measured using a thermocouple. The time $t_{(1/2)}$ taken for this temperature to rise by ½ of a temperature rise amount ΔT was calculated from the measurement results and used as an index for evaluation of the heat dissipation properties. Here, although the heat dissipation properties with respect to heat dissipation from the support toward the die via the joint portion were evaluated for convenience of the test, the direction in which heat is applied is not essential to the evaluation of the present invention. The temperature rise amount ΔT corresponds to the difference between the maximum temperature value after the laser irradiation and the temperature prior to the laser irradiation. A smaller $t_{(1/2)}$ indicates faster transfer of the heat incident on the back surface of the support to the surface of the die and therefore indicates more favorable heat dissipation properties.

TABLE 1

| | $t_{(1/2)}$ [sec] |
|---|---|
| Example 1 | 0.44 |
| Comparative Example 1 | Not measurable |
| Comparative Example 2 | 0.70 |
| Comparative Example 3 | 0.80 |

TABLE 2

| | $t_{(1/2)}$ [sec] |
|---|---|
| Example 2 | 0.52 |
| Comparative Example 4 | Not measurable |
| Comparative Example 5 | 0.63 |
| Comparative Example 6 | 0.60 |

As is clear from the results shown in Tables 1 and 2, the bonding structures obtained in the examples had superior heat dissipation properties to the bonding structures of the comparative examples.

Example 3

In the present example, a die bonding joining structure composed of nickel and having the structure shown in FIG. 1 was produced.

(1) Production of Nickel Paste

A nickel powder NN-20 manufactured by Mitsui Mining & Smelting Co., Ltd. was used. The average particle diameter D of primary particles of this nickel powder was 20 nm. A nickel paste was obtained by kneading 85 parts of this nickel powder and 15 parts of triethanolamine (manufactured by Kanto Chemical Co., Inc.) using a triple roll mill.

(2) Production of Die Bonding Joining Structure

Figure 7A:
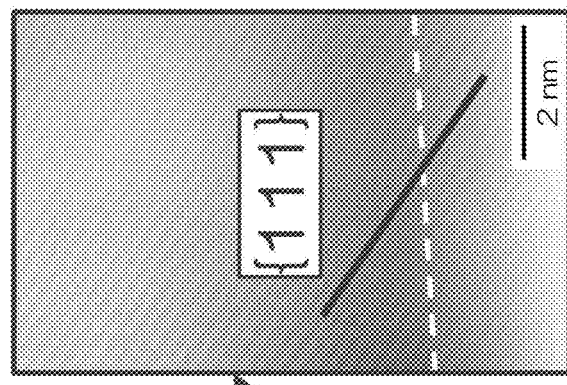
FIG. 7 shows transmission electron microscope images of a portion in the vicinity of the bonding interface of a die bonding joining structure obtained in Example 3.
Figure 7B:
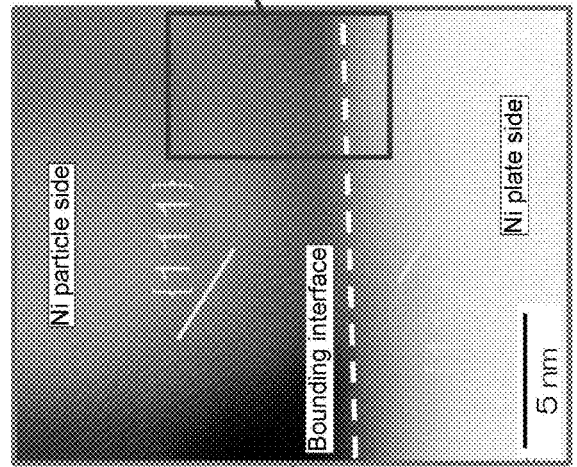
Figure 7C:
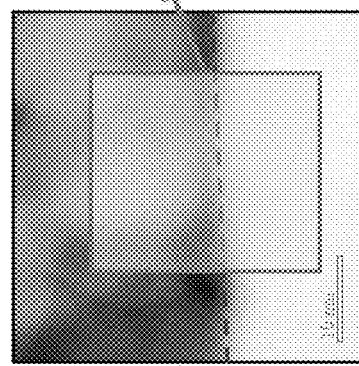

The nickel paste was applied to a support formed of a 15-mm-square nickel plate (99.98% purity) with a thickness of 0.1 mm through screen printing using a metal mask with a thickness of 50 μm such that the applied nickel paste was formed into a shape 10 mm square. A 10-mm-square nickel plate (99.98% purity) with a thickness of 0.1 mm was placed on the center of the support as a die. The temperature was increased to 300° C. at a rate of 5° C./min in air and was kept for 30 minutes to give a target bonding structure. FIG. 7 shows TEM images of a portion in the vicinity of the bonding interface between the sintered body and the support of the obtained bonding structure. As is clear from FIG. 7, it was found that an interdiffusion portion of the nickel of the support and the nickel of the sintered body was formed so as to straddle the bonding interface between the support and the sintered body, and a nickel crystal structure having the same crystal orientation was formed in the interdiffusion portion so as to straddle the bonding interface.

Example 4

In the present example, a die bonding joining structure composed of silver and having the structure shown in FIG. 1 was produced.

(1) Production of Silver Paste

A silver powder SPQ-05S manufactured by Kamioka Mining and Smelting Co., Ltd. was used. This silver powder had a crystallite diameter of 21 nm, an average particle diameter D of 1.05 μm, and a specific surface area of 1.00 m²/g. A silver paste was obtained by kneading 99 parts of this silver powder, 1 part of ethyl cellulose (ETHOCEL STD 100 manufactured by Nisshin & Co., Ltd.), and 17 parts of terpineol (manufactured by Nippon Terpene Chemicals, Inc.) using a triple roll mill.

(2) Production of Die Bonding Joining Structure

The silver paste was applied to a support formed of a 15-mm-square silver plate (99.98% purity) with a thickness of 0.1 mm through screen printing using a metal mask with a thickness of 50 μm such that the applied silver paste was formed into a shape 10 mm square. A 10-mm-square silver plate (99.98% purity) with a thickness of 0.1 mm was placed on the center of the support as a die. The temperature was increased to 300° C. at a rate of 5° C./min in air and was kept for 30 minutes to give a target bonding structure. FIG. 8 shows TEM images of a portion in the vicinity of the bonding interface between the sintered body and the support of the obtained bonding structure. As is clear from FIG. 8, it was found that an interdiffusion portion in which silver contained in the support and silver contained in the sintered body are diffused to each other was formed so as to straddle the bonding interface between the support and the sintered body, and a silver crystal structure having the same crystal orientation was formed in the interdiffusion portion so as to straddle the bonding interface.

INDUSTRIAL APPLICABILITY

According to the bonding joining structure of the present invention, heat generated from various heat generating bodies including a die of a semiconductor device is efficiently conducted to a support. That is to say, the bonding joining structure of the present invention has excellent heat dissipation properties. Therefore, the bonding joining structure of the present invention is especially useful as a bonding structure for a power device that is used in a power conversion apparatus, such as a converter or an inverter, for power control of that power conversion apparatus.

REFERENCE SIGNS LIST

1 Die bonding joining structure
10 Die of semiconductor device
20 Support
30 Joint portion
31 Copper particle
32 Sintered body
40, 43 Bonding interface
41, 44 Interdiffusion portion

The invention claimed is:

1. A bonding joining structure in which a heat generating body and a support comprising a metal are joined to each other via a joint portion composed of a sintered body of copper powder,
    wherein the support contains copper or gold, the copper or gold being present in at least an outermost surface of the support, and
    an interdiffusion portion in which copper or gold contained in the support and copper contained in the sintered body are diffused to each other is formed so as to straddle a bonding interface between the support and the sintered body.

2. The bonding joining structure according to claim 1,
    wherein the bonding joining structure is a die bonding joining structure in which a die of a semiconductor device, the die serving as the heat generating body, and the support comprising a metal are joined to each other via the joint portion composed of the sintered body of the copper powder, the support contains copper or gold, the copper or gold being present in at least the outermost surface of the support, and the interdiffusion portion in which copper or gold contained in the support and copper contained in the sintered body are diffused to each other is formed so as to straddle the bonding interface between the support and the sintered body.

3. The bonding joining structure according to claim 2, wherein copper is present in the outermost surface of the support, and a copper crystal structure having the same crystal orientation is formed in the interdiffusion portion so as to straddle the bonding interface.

4. The bonding joining structure according to claim 3, wherein the copper crystal structure having the same crystal orientation has a traverse length of 10 nm or more at the bonding interface.

5. The bonding joining structure according to claim 3, wherein a gold layer is formed on a bottom surface of the die, the interdiffusion portion in which gold contained in the bottom surface of the die and copper contained in the sintered body are diffused to each other is formed so as to straddle a bonding interface between the die and the sintered body, and the interdiffusion portion contains $Cu_3Au$.

6. The bonding joining structure according to claim 5, wherein the interdiffusion portion contains $Cu_3Au$ and a solid solution of gold and copper.

7. The bonding joining structure according to claim 4, wherein a gold layer is formed on a bottom surface of the die, the interdiffusion portion in which gold contained in the bottom surface of the die and copper contained in the sintered body are diffused to each other is formed so as to straddle a bonding interface between the die and the sintered body, and the interdiffusion portion contains $Cu_3Au$.

8. The bonding joining structure according to claim 7, wherein the interdiffusion portion contains $Cu_3Au$ and a solid solution of gold and copper.

9. The bonding joining structure according to claim 2, wherein gold is present in the outermost surface of the support, and the interdiffusion portion contains $Cu_3Au$.

10. The bonding joining structure according to claim 9, wherein the interdiffusion portion contains $Cu_3Au$ and a solid solution of gold and copper.

11. The bonding joining structure according to claim 9, wherein a gold layer is formed on a bottom surface of the die, the interdiffusion portion in which gold contained in the bottom surface of the die and copper contained in the sintered body are diffused to each other is formed so as to straddle a bonding interface between the die and the sintered body, and the interdiffusion portion contains $Cu_3Au$.

12. The bonding joining structure according to claim 11, wherein the interdiffusion portion contains $Cu_3Au$ and a solid solution of gold and copper.

13. The bonding joining structure according to claim 2, wherein a gold layer is formed on a bottom surface of the die, the interdiffusion portion in which gold contained in the bottom surface of the die and copper contained in the sintered body are diffused to each other is formed so as to straddle a bonding interface between the die and the sintered body, and the interdiffusion portion contains $Cu_3Au$.

14. The bonding joining structure according to claim 13, wherein the interdiffusion portion contains $Cu_3Au$ and a solid solution of gold and copper.

15. A bonding joining structure in which a heat generating body and support comprising a metal are joined to each other via a joint portion composed of a sintered body of nickel powder, wherein the support contains nickel, the nickel being present in at least an outermost surface of the support, and an interdiffusion portion in which nickel contained in the support and nickel contained in the sintered body are diffused to each other is formed so as to straddle a bonding interface between the support and the sintered body.

16. A bonding joining structure in which a heat generating body and a support comprising a metal are joined to each other via a joint portion composed of a sintered body of silver powder, wherein the support contains silver, the silver being present in at least an outermost surface of the support, and an interdiffusion portion in which silver contained in the support and silver contained in the sintered body are diffused to each other is formed so as to straddle a bonding interface between the support and the sintered body.

* * * * *